US007671377B2

(12) United States Patent
Kim et al.

(10) Patent No.: US 7,671,377 B2
(45) Date of Patent: Mar. 2, 2010

(54) SILICON BASED LIGHT EMITTING DIODE

(75) Inventors: Tae-Youb Kim, Seoul (KR); Nae-Man Park, Daejeon (KR); Kyung-Hyun Kim, Daejeon (KR); Gun-Yong Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 440 days.

(21) Appl. No.: 11/720,987

(22) PCT Filed: Nov. 14, 2005

(86) PCT No.: PCT/KR2005/003847

§ 371 (c)(1), (2), (4) Date: Jun. 6, 2007

(87) PCT Pub. No.: WO2006/062300

PCT Pub. Date: Jun. 15, 2006

(65) Prior Publication Data

US 2009/0242913 A1 Oct. 1, 2009

(30) Foreign Application Priority Data

Dec. 8, 2004 (KR) ...................... 10-2004-0102956
May 4, 2005 (KR) ...................... 10-2005-0037623

(51) Int. Cl.
*H01L 33/00* (2006.01)
*H01L 29/06* (2006.01)

(52) U.S. Cl. ......................... 257/98; 257/103; 257/618; 257/623; 257/625; 257/626; 257/E51.021; 257/E33.069; 438/72

(58) Field of Classification Search .................. 257/98, 257/E51.021, E33.069, 103, 618, 623, 625, 257/626; 438/72
See application file for complete search history.

(56) References Cited

U.S. PATENT DOCUMENTS 5,404,370 A * 4/1995 Otsubo et al. ............ 372/45.01

(Continued)

FOREIGN PATENT DOCUMENTS

JP 55033031 3/1980

(Continued)

OTHER PUBLICATIONS

Optical Microcavities Based on Amorphous Silicon-nitride Fabry-Perot Structures: Fabrizio Giorgis; Applied Physics Letters, vol. 77, No. 4, Jul. 24, 2000.*

(Continued)

*Primary Examiner*—Zandra Smith
*Assistant Examiner*—Jeremy J Joy
(74) *Attorney, Agent, or Firm*—Kile Goekjian Reed & McManus PLLC

(57) ABSTRACT

Provided is a highly efficient silicon-based light emitting diode (LED) including a Distributed Bragg Reflector (DBR), an n-type doping layer, and a p-type substrate structure. The silicon-based LED includes: a substrate having a p-type mesa substrate structure; an active layer that is formed on the substrate and has a first surface and a second surface opposite the first surface; a first reflective layer facing the first surface of the active layer; a second reflective layer that is located on either side of the p-type substrate structure and faces the second surface of the active layer; an n-type doping layer sandwiched between the active layer and the first reflective layer; a first electrode electrically connected to the n-type doping layer; and a second electrode electrically connected to the p-type substrate structure.

16 Claims, 3 Drawing Sheets

122 122 110 130 130 106 104a 104 104b 120 120 108 100 124 W

U.S. PATENT DOCUMENTS

| | | | | |
|---|---|---|---|---|
| 5,491,350 | A * | 2/1996 | Unno et al. | 257/99 |
| 5,585,648 | A * | 12/1996 | Tischler | 257/77 |
| 5,684,307 | A * | 11/1997 | Ishimura | 257/184 |
| 6,744,071 | B2 * | 6/2004 | Sano et al. | 257/79 |
| 7,049,635 | B2 * | 5/2006 | Sano et al. | 257/79 |
| 7,446,342 | B2 * | 11/2008 | Tazima et al. | 257/79 |
| 2005/0121678 | A1 * | 6/2005 | Ezaki et al. | 257/79 |
| 2008/0048202 | A1 * | 2/2008 | Tazima et al. | 257/98 |

FOREIGN PATENT DOCUMENTS

| | | | | |
|---|---|---|---|---|
| JP | 55033031 | A | * | 3/1980 |
| JP | 11261157 | | | 9/1999 |
| JP | 11261157 | A | * | 9/1999 |
| JP | 2000031589 | | | 1/2000 |
| JP | 2000031589 | A | * | 1/2000 |
| KR | 1020020023117 | | | 3/2002 |
| KR | 1020020023117 | | * | 1/2003 |

OTHER PUBLICATIONS

Written Opinion of the International Searching Authority; PCT/KR2005/003847; Feb. 21, 2006.

International Search Report; PCT/KR2005/003847; Feb. 21, 2006.

Optical microcavities based on amorphous silicon-nitride Fabry-Perot structures; Fabrizio Giorgis; Applied Physics Letters, vol. 77, No. 4, Jul. 24, 2000.

All the references in Search Report and not previously submitted are listed above.

* cited by examiner

SILICON BASED LIGHT EMITTING DIODE

CROSS-REFERENCE TO RELATED PATENT APPLICATION

This application claims the benefit of Korean Patent Application No. 10-2004-0102956, filed on 8 Dec. 2004 and Korean Patent Application No. 10-2005-0037623, filed on 4 May 2005 in the Korean Intellectual Property Office, the disclosures of which are incorporated herein in their entirety by reference.

BACKGROUND OF THE INVENTION

1. Field of the Invention

The present invention relates to a method of manufacturing a semiconductor device, and more particularly, to a silicon-based light emitting diode (LED) including a distributed Bragg reflector (DBR).

2. Description of the Related Art

Much research has been conducted into silicon-based LEDs using silicon nano-size dots, because they are easily compatible with silicon-based photoelectronic devices and have low manufacturing costs. However, current silicon-based LEDs are not widely used in commercial applications because of their low emission efficiency and wide emission spectrum.

A DBR with a high reflectance is used in various photoelectronic devices designed for light-emission, photo detection, light modulation, and other functions. A DBR is a multilayer mirror composed of alternating layers of two materials having different refractive indices, and reflects light using the difference between the refractive indices of the layers.

In a typical compound semiconductor LED, a doping material is injected into a DBR to achieve high emission efficiency and narrow emission spectrum. However, in a silicon-based LED using silicon nano-size dots, there is a problem indirectly doping a DBR, because the DBR is typically composed of insulating materials such as silicon oxide and silicon nitride, according to an underlying structure including an active layer. Furthermore, since a large band-gap semiconductor doping layer always has an n-type conductivity, it is very difficult to form a p-type semiconductor doping layer. Given the shortcomings of the silicon-based LED, there is a need to develop a doping layer and an LED structure for effectively injecting electrons and holes.

SUMMARY OF THE INVENTION

The present invention provides a silicon-based LED designed to achieve high emission efficiency and narrow emission spectrum using an n-type doping layer and a distributed Bragg reflector (DBR) without the need to inject a doping material directly into the DBR.

According to an aspect of the present invention, there is provided a silicon-based LED including a substrate having a p-type mesa substrate structure. An active layer is formed on the substrate and has a first surface and a second surface opposite the first surface. A first reflective layer faces the first surface of the active layer while a second reflective layer faces the second surface of the active layer. The second reflective layer is located on either side of the p-type substrate structure. An n-type doping layer is sandwiched between the active layer and the first reflective layer. A first electrode is electrically connected to the n-type doping layer while a second electrode is electrically connected to the p-type substrate structure.

The p-type substrate structure penetrates the second reflective layer and contacts the second surface of the active layer. The first electrode may surround the first reflective layer, and the p-type substrate structure may be located below the portion of the first reflective layer surrounded by the first electrode. For example, the first electrode may have a top of ring shape or polygonal shape. A light-emitting region is confined within the portion of the first reflective layer surrounded by the first electrode.

The first and second reflective layers may each include a Distributed Bragg Reflector (DBR) consisting of a stack of alternating layers of silicon-containing insulating materials having different compositions. The n-type doped layer may be formed of an n-type compound semiconductor. The active layer may be formed of crystalline or amorphous silicon nano-size dots.

The silicon-based LED uses only the n-type doping layer to form a reflective layer on both surfaces of the active layer, thereby offering high emission efficiency, narrow emission spectrum, and improved electroluminescence characteristics.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

To improve the performance of a light emitting diode (LED), it is very important to effectively arrange an active layer for generating light, a doped layer in which carriers are injected, and a reflective layer for effectively reflecting light. In particular, the effective arrangement of a doping layer and an active layer is important in a silicon-based LED using silicon nano-size dots offering low self-emission.

Figure 1:
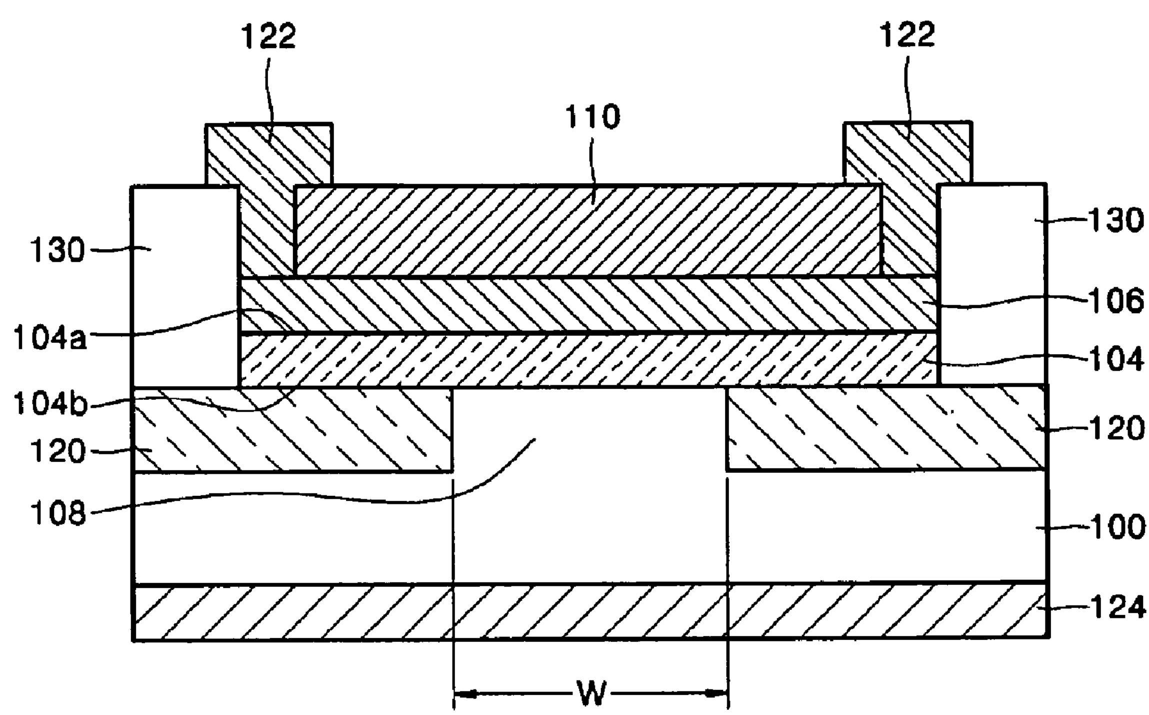
FIG. 1 is a cross-sectional view of a main portion of a silicon-based light emitting diode (LED) according to a preferred embodiment of the present invention.
Figure 2:
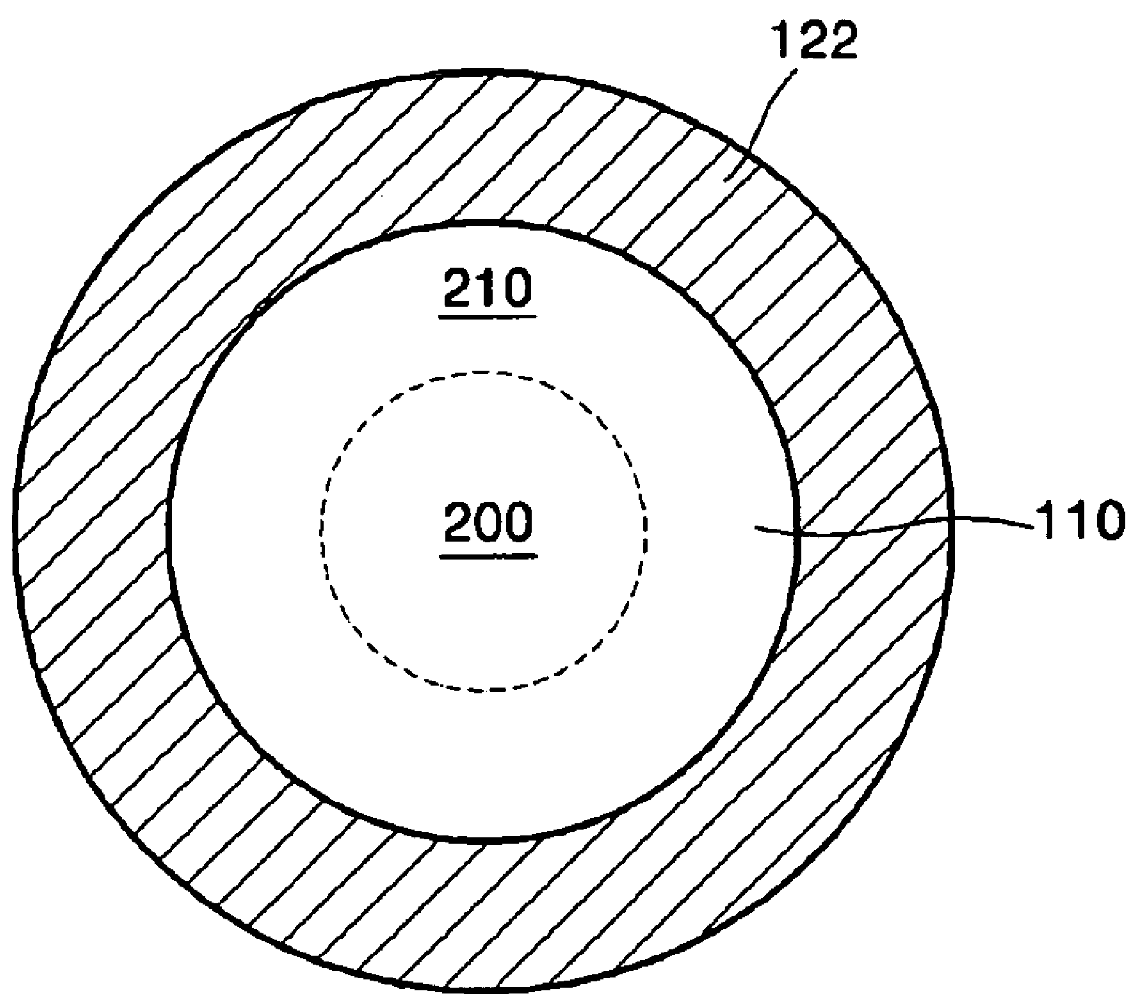
FIG. 2 is a plan view of a portion of FIG. 1.

Referring to FIGS. 1 and 2, a silicon-based light emitting diode (LED) according to an embodiment of the present invention includes a substrate 100, for example, p-type silicon substrate, and an active layer 104 that is formed on the substrate 100 and has a first surface **104*a* and a second surface 104*b* opposite the first surface 104*a*. The substrate 100 has a p-type mesa structure 108. The active layer 104** is formed of crystalline or amorphous silicon nano-size dots, and may have a thickness of 10 nm to 100 μm.

A first reflective layer 110 faces the first surface **104*a* of the active layer 104, while a second reflective layer 120 faces the second surface 104*b*. The second reflective layer 120 is located on either side of the p-type substrate structure 108. To transport holes into the active layer 104, the p-type substrate structure 108 penetrates the second reflective layer 120 and has a top surface contacting the second surface 104*b* of the active layer 104**.

Figure 3:
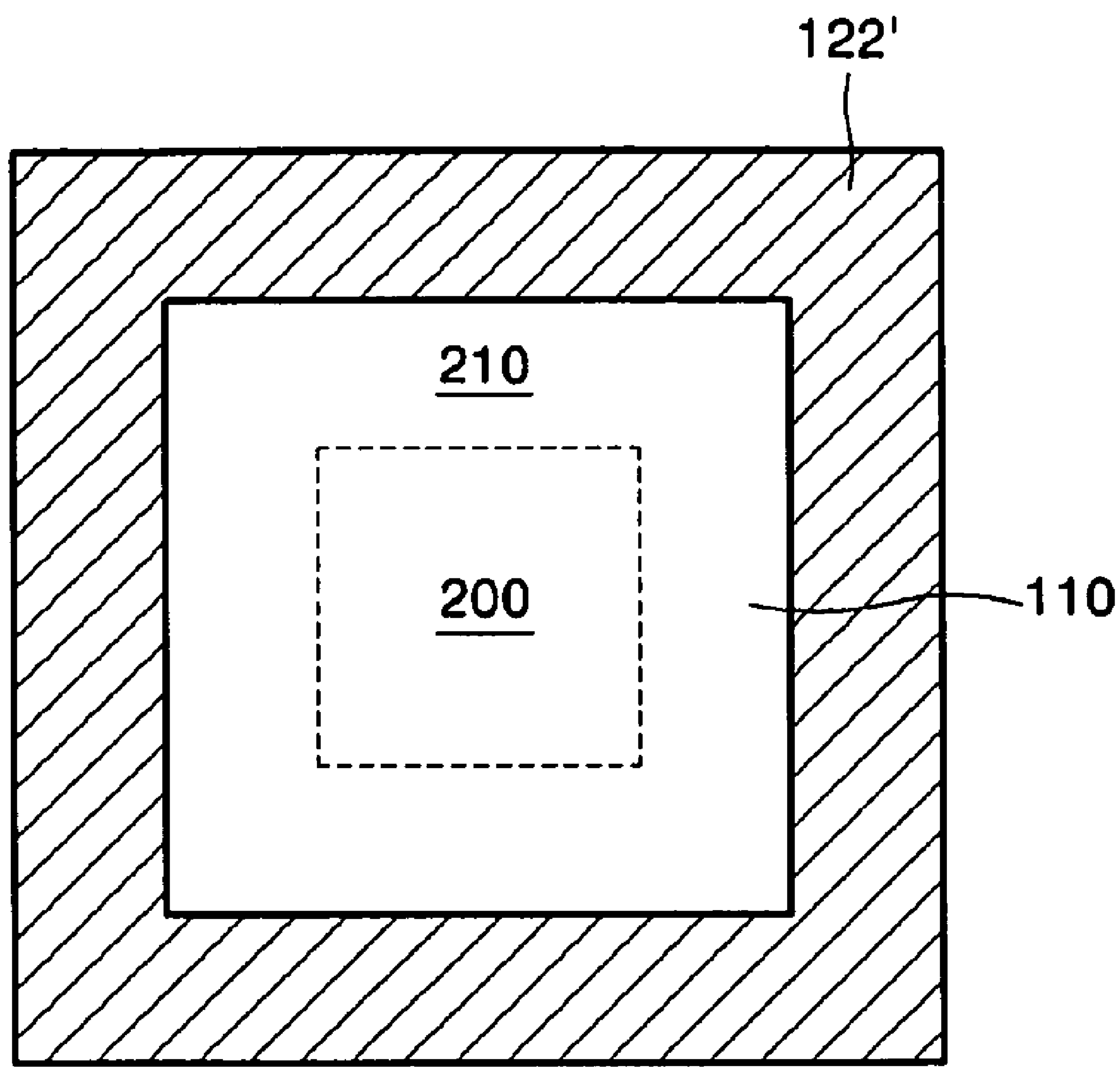
FIG. 3 is a plan view of a main portion of a silicon-based LED according to another preferred embodiment of the present invention.

As illustrated in FIGS. 1 and 2, a first electrode 122 is shaped to completely surround the first reflective layer 110. While FIG. 2 shows that the first electrode 122 has a top of circular shape, it may have a ring shape of circular or elliptical, or have a polygonal shape. FIG. 3 shows a rectangular first electrode 122'. Like reference numerals in FIGS. 2 and 3 denote like elements, and thus their description will be omitted to avoid redundancy. Unless otherwise described, the description of the elements shown in FIG. 2 will apply to elements shown in FIG. 3.

The p-type substrate structure 108 is located below a portion of the first reflective layer 110 surrounded by the first electrode 122. The p-type substrate structure 108 may have a width W of 0.01 to 10 mm.

The portion of the first reflective layer 110 surrounded by the first electrode 122 corresponds to a light-emitting region 200. A portion of the light-emitting region 200 in proximity to the first electrode 122 may be a highly efficient light-emitting region 210. The highly efficient light-emitting region 210 may have a width of 10 nm to 1 μm.

An n-type doping layer 106 sandwiched between the active layer 104 and the first reflective layer 110 is made of an n-type compound semiconductor such as ZnO, InSnO, NiO, SiC, or $SnO_2$. A reference numeral 130 in FIG. 1 denotes an insulating layer.

The second reflective layer 120 facing the second surface 104*b* of the active layer 104 is in direct contact with the second surface 10.

The first electrode 122 is electrically connected to the n-type doping layer 106, while a second electrode 124 is electrically connected to the p-type substrate structure 108. The first and second electrodes 122 and 124 may be made of metal and have a thickness of 100 μm to 5 mm.

In the silicon-based LED having the above configuration, the first and second reflective layers 110 and 120 each consist of a distributed Bragg reflector (DBR) composed of a sequence of alternating silicon-containing insulating layers having different compositions. The refractive index difference between the alternating insulating layers may be 0.1 to 0.5. More preferably, the DBR is formed from a repeated stack of alternating layers of $SiO_2$ and SiN. For example, the DBR may include 2 to 20 pairs of alternating layers of $SiO_2$ and SiN.

The first electrode 122 surrounding the first reflective layer 110 acts to transport electrons into the n-type doping layer 106. Furthermore, holes injected through the second electrode 124 are moved into the p-type substrate structure 108 through the p-type substrate 100.

In the configuration shown in FIG. 1, when current is applied to the first and second electrodes 122 and 124, carriers composed of electrons or holes reach the n-type doping layer 106 and the p-type substrate structure 108 through the first reflective layer 110 the p-type substrate 100. Because the DBRs constituting the first and second reflective layers 110 and 120 consist of a stack of alternating insulating layers of $SiO_2$ and SiN, as shown in FIG. 1, the p-type substrate 100 having the p-type mesa substrate structure 108 and the n-type doping layer 106 are used to effectively inject carriers into the active layer 104. More specifically, electrons injected through the first electrode 122 pass through the first reflective layer 110 to reach the n-type doping layer 106, and are stably injected into the first surface 104*a* of the active layer 104 through the n-type doping layer 106. Holes injected through the second electrode 124 reach the p-type substrate 100 and the p-type substrate structure 108, and are then injected into the second surface 104*b* of the active layer 104. The active layer 104 then emits light using silicon nano-size dots. The light confined between the first and second reflective layers 110 and 120 oscillates so as to selectively amplify and emit a narrow spectrum.

Referring to FIGS. 2 and 3, the light-emitting region 200 of the silicon-based LED according to the present invention may be limited to the portion of the first reflective layer 110 enclosed by the first electrode 122 or 122'. When an actual silicon-based LED operates, it can be confirmed that the light-emitting region 200 is the entire region of the first reflective layer 110 surrounded by the first electrode 122 or 122' and the highly efficient light-emitting region 210 is located around the outer edge portion of the light-emitting region 200 in proximity to the first electrode 122 or 122'.

A silicon-based LED with silicon nano-size dots used as an active layer according to the present invention uses an n-type doping layer and a reflective layer including a DBR that are easy to manufacture, to achieve improved performance. The silicon-based LED offers high emission efficiency, narrow emission spectrum, stable operation characteristics, and improved electroluminescence properties.

The silicon-based LED can be widely used in various optical devices for light-emission, photodetection, light modulation, and other functions.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A silicon-based light emitting diode (LED), comprising:
- a substrate having a p-type mesa substrate structure;
- an active layer that is formed on the substrate and has a first surface and a second surface opposite the first surface;
- a first reflective layer facing the first surface of the active layer;
- a second reflective layer that is located on either side of the p-type mesa substrate structure and faces the second surface of the active layer;
- an n-type doping layer sandwiched between the active layer and the first reflective layer;
- a first electrode electrically connected to the n-type doping layer; and
- a second electrode electrically connected to the p-type mesa substrate structure.

2. The LED of claim 1, wherein the p-type mesa substrate structure penetrates the second reflective layer and contacts the second surface of the active layer.

3. The LED of claim 2, wherein the first electrode surrounds the first reflective layer, and
- wherein the p-type mesa substrate structure is located below a portion of the first reflective layer surrounded by the first electrode.

4. The LED of claim 1, wherein the first electrode is formed on the n-type doping layer and is shaped to completely surround the first reflective layer.

5. The LED of claim 4, wherein the first electrode has a top of ring shape or polygonal shape.

6. The LED of claim 4, further comprising a light-emitting region located within the portion of the first reflective layer surrounded by the first electrode.

7. The LED of claim 1, wherein the p-type mesa substrate structure has a width of 0.01 to 10 mm.

8. The LED of claim 1, wherein the first and second reflective layers each include a Distributed Bragg Reflector (DBR) consisting of a stack of alternating layers of silicon-containing insulating materials having different compositions.

9. The LED of claim 8, wherein the first and second reflective layers are respectively composed of first and second insulating layers having different compositions, and the refractive index difference between the first and second insulating layers is 0.1 to 1.5.

10. The LED of claim 9, wherein the first and second reflective layers each include 2 to 20 pairs of first and second insulating layers.

11. The LED of claim 8, wherein the first and second reflective layers are each composed of a repeated stack of alternating layers of silicon oxide and silicon nitride.

12. The LED of claim 1, wherein the n-type doping layer is formed of an n-type compound semiconductor.

13. The LED of claim 12, wherein the n-type doping layer is made of a compound selected from the group consisting of ZnO, InSnO, NiO, SiC, and $SnO_2$.

14. The LED of claim 1, wherein the active layer is formed of crystalline or amorphous silicon nano-size dots.

15. The LED of claim 1, wherein the active layer has a thickness of 10 nm to 100 μm.

16. The LED of claim 1, wherein the first and second electrodes are each made of a metal layer having a thickness of 100 μm to 5 mm.

* * * * *